United States Patent
Lin et al.

(10) Patent No.: US 10,263,564 B2
(45) Date of Patent: Apr. 16, 2019

(54) VOLTAGE-CONTROLLED OSCILLATOR

(71) Applicant: National Chi Nan University, Puli, Nantou (TW)

(72) Inventors: Yo-Sheng Lin, Nantou (TW); Yu-Ching Lin, Nantou (TW)

(73) Assignee: NATIONAL CHI NAN UNIVERSITY, Puli, Nantou (TW)

( * ) Notice: Subject to any disclaimer, the term of this patent is extended or adjusted under 35 U.S.C. 154(b) by 165 days.

(21) Appl. No.: 15/374,736

(22) Filed: Dec. 9, 2016

(65) Prior Publication Data

US 2017/0359024 A1 Dec. 14, 2017

(30) Foreign Application Priority Data

Jun. 14, 2016 (TW) .............................. 105118502 A

(51) Int. Cl.
*H03B 5/12* (2006.01)
*H03B 5/18* (2006.01)

(52) U.S. Cl.
CPC ......... *H03B 5/1228* (2013.01); *H03B 5/1215* (2013.01); *H03B 5/1243* (2013.01); *H03B 5/1852* (2013.01); *H03B 2200/0034* (2013.01)

(58) Field of Classification Search
CPC ............................ H03B 5/1228; H03B 5/1243
See application file for complete search history.

(56) References Cited

U.S. PATENT DOCUMENTS

2010/0277250 A1* 11/2010 Aga .................... H03B 5/1228
331/117 R
2012/0062287 A1* 3/2012 Jang .................... H03B 5/1228
327/156

OTHER PUBLICATIONS

Changhau Cao, A 50-GHz Phase-Locked Loop in 0.13-um CMOS, IEEE Journal of Solid-State Circuits, vol. 42, Aug. 2007 1649-1656.*

* cited by examiner

*Primary Examiner* — Jeffrey M Shin
(74) *Attorney, Agent, or Firm* — Merchant & Gould P.C.

(57) ABSTRACT

A voltage-controlled oscillator includes a first transistor, a second transistor, a first center-tapped inductor, two first varactors, a second center-tapped inductor and two second varactors. The first and second transistors cooperatively form a cross-connected pair. The first center-tapped inductor and the first varactors cooperatively form a first LC tank. The second center-tapped inductor and the second varactors cooperatively form a second LC tank. The cross-connected pair is connected between the first and second LC tanks. The first and second center-tapped inductors are mutual-inductively coupled to each other. An oscillation signal pair is provided between the first LC tank and the cross-connected pair.

19 Claims, 15 Drawing Sheets

VOLTAGE-CONTROLLED OSCILLATOR

CROSS-REFERENCE TO RELATED APPLICATION

This application claims priority of Taiwanese Patent Application No. 105118502, filed on Jun. 14, 2016.

FIELD

The disclosure relates to a voltage-controlled oscillator (VCO), and more particularly to a VCO used for a radio frequency circuit.

BACKGROUND

A voltage-controlled oscillator (VCO) is a major component in a wireless communication system such as a mobile phone, a wireless network card, etc. The VCO may cooperate with components including a phase frequency detector, a charge pump, a loop filter, a frequency divider, etc., to form a radio frequency integrated circuit. For mobile communications, it is important to improve the performance, as well as to reduce an occupied area and costs of the VCO.

Referring to FIG. 1, a conventional VCO includes two inductors (Ld) and two varactors (Cd1) that cooperatively form an LC tank 7, and two transistors (M) that cooperatively form a cross-connected pair 8. The cross-connected pair 8 is connected between the LC tank 7 and ground. Each varactor (Cd1) has a capacitance variable according to a control voltage (Vt). The control voltage (Vt) may be adjusted to change the capacitances of the varactors (Cd1), thereby adjusting a frequency of a differential output signal pair generated by the conventional VCO.

The conventional VCO has the following drawbacks:

1. The inductors (Ld) occupy a relatively large area, which is adverse in reducing the occupied area and the costs of the conventional VCO.

2. Only the capacitances of the varactors (Cd1) are variable, and therefore an adjustable range of the output frequency is relatively narrow.

3. Only one differential output signal pair is provided, and therefore the conventional VCO is not suitable for a system that operates based on multiple differential output signal pairs with different frequencies.

SUMMARY

Therefore, an object of the disclosure is to provide a voltage-controlled oscillator (VCO) that can alleviate at least one of the drawbacks of the prior art.

According to the disclosure, the VCO includes a first transistor, a second transistor, a first center-tapped inductor, two first varactors, a second center-tapped inductor and two second varactors. The first transistor has a first terminal, a second terminal and a control terminal. The second transistor has a first terminal that is connected to the control terminal of the first transistor, a second terminal, and a control terminal that is connected to the first terminal of the first transistor. The first center-tapped inductor has a first end terminal that is connected to the first terminal of the first transistor, a second end terminal that is connected to the first terminal of the second transistor, and a center terminal. Each of the first varactors has a first terminal that is used to receive a first control voltage, a second terminal that is connected to the first terminal of a respective one of the first and second transistors, and a capacitance that is variable according to the first control voltage. The second center-tapped inductor is mutual-inductively coupled to the first center-tapped inductor, and has a first end terminal that is connected to the second terminal of the first transistor, a second end terminal that is connected to the second terminal of the second transistor, and a center terminal that is connected to a reference node. Each of the second varactors has a first terminal that is used to receive a second control voltage, a second terminal that is connected to the second terminal of a respective one of the first and second transistors, and a capacitance that is variable according to the second control voltage. A first oscillation signal with a first oscillation frequency is provided at the first terminal of the first transistor, and a second oscillation signal with the first oscillation frequency is provided at the first terminal of the second transistor.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Figure 1:
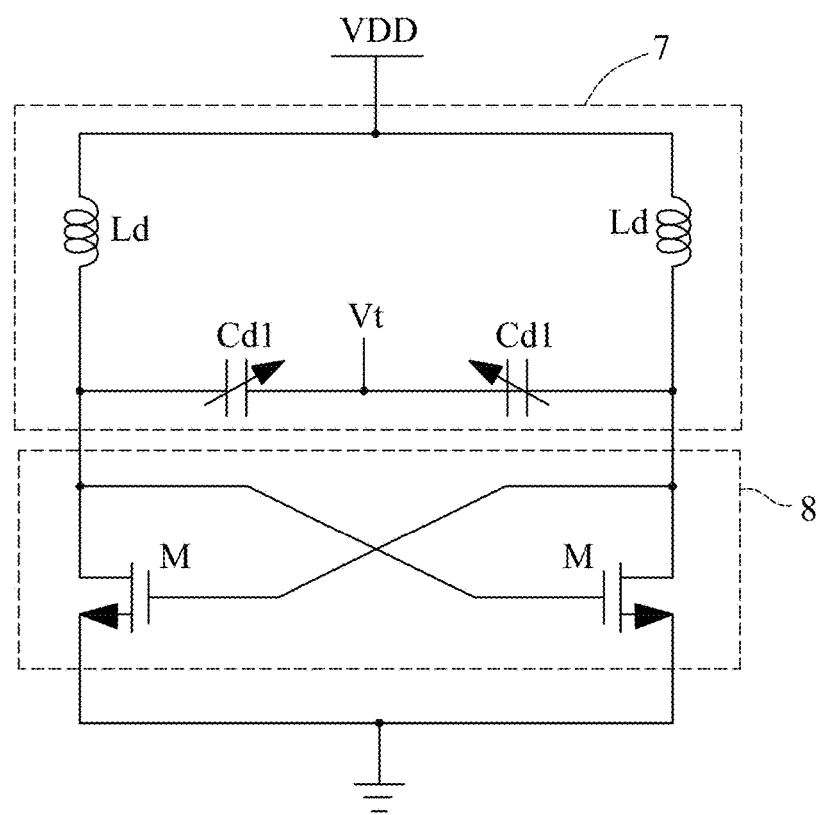
FIG. 1 is a circuit diagram illustrating a conventional voltage-controlled oscillator (VCO)

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
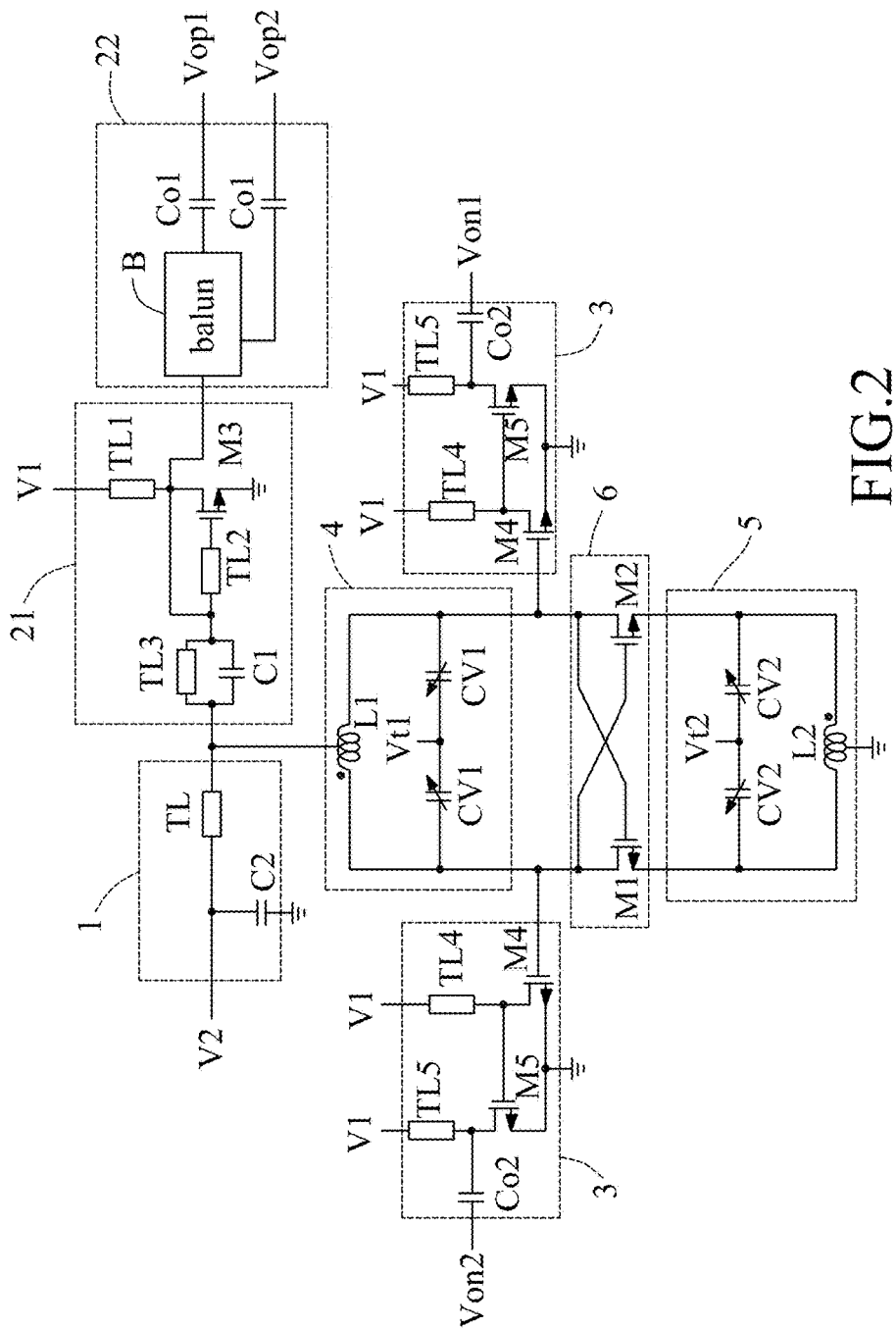
FIG. 2 is a circuit block diagram illustrating a first embodiment of a VCO according to the disclosure.

Referring to FIG. 2, a first embodiment of a voltage-controlled oscillator (VCO) according to the disclosure includes a first transistor (M1), a second transistor (M2), a first center-tapped inductor (L1), two first varactors (CV1), a second center-tapped inductor (L2), two second varactors (CV2), a push-push module 1, an amplifying module 21, a single-ended to differential converting module 22 and two buffering modules 3.

The first transistor (M1) has a first terminal, a second terminal and a control terminal. The second transistor (M2) has a first terminal that is connected to the control terminal of the first transistor (M1), a second terminal, and a control terminal that is connected to the first terminal of the first transistor (M1). The first and second transistors (M1, M2) cooperatively form a cross-connected pair 6.

The first center-tapped inductor (L1) has a first end terminal that is connected to the first terminal of the first transistor (M1), a second end terminal that is connected to the first terminal of the second transistor (M2), and a center terminal. Each first varactor (CV1) has a first terminal that is used to receive a first control voltage (Vt1), a second terminal that is connected to the first terminal of a respective one of the first and second transistors (M1, M2), and a capacitance that is variable according to the first control voltage (Vt1). The first center-tapped inductor (L1) and the first varactors (CV1) cooperatively form a first LC tank 4.

The second center-tapped inductor (L2) is mutual-inductively coupled to the first center-tapped inductor (L1), and has a first end terminal that is connected to the second terminal of the first transistor (M1), a second end terminal that is connected to the second terminal of the second transistor (M2), and a center terminal that is connected to a reference node (e.g., ground). Each second varactor (CV2) has a first terminal that is used to receive a second control voltage (Vt2), a second terminal that is connected to the second terminal of a respective one of the first and second transistors (M1, M2), and a capacitance that is variable according to the second control voltage (Vt2). The second center-tapped inductor (L2) and the second varactors (CV2) cooperatively form a second LC tank 5. In this embodiment, the first end terminal of the first center-tapped inductor (L1) and the second end terminal of the second center-tapped inductor (L2) have the same voltage polarity.

The first and second LC tanks 4, 5 and the cross-connected pair 6 cooperatively generate a first oscillation signal with a first oscillation frequency of f0 at the first terminal of the first transistor (M1), cooperatively generate a second oscillation signal with the first oscillation frequency of f0 at the first terminal of the second transistor (M2), and cooperatively generate a third oscillation signal at the center terminal of the first center-tapped inductor (L1). The first and second oscillation signals cooperatively constitute a differential oscillation signal pair. The first and second control voltages (Vt1, Vt2) may be adjusted to change the capacitances of the first and second varactors (CV1, CV2), thereby adjusting the first oscillation frequency of f0. The cross-connected pair 6 provides a negative resistance to compensate energy losses of the first and second LC tanks 4, 5, such that resonances of the first and second LC tanks 4, 5 are sustained.

Each buffering module 3 is connected to the first terminal of a respective one of the first and second transistors (M1, M2) for receiving a respective one of the first and second oscillation signals therefrom. Each buffering module 3 buffers the respective one of the first and second oscillation signals to generate a respective one of a first output signal (Von1) and a second output signal (Von2) that cooperatively constitute a first differential output signal pair with the first oscillation frequency of f0. In this embodiment, each buffering module 3 includes a third transistor (M4), a first inductor (TL4), a fourth transistor (M5), a second inductor (TL5) and a first capacitor (Co2). The third transistor (M4) has a first terminal, a second terminal that is connected to the reference node, and a control terminal that is connected to the first terminal of the respective one of the first and second transistors (M1, M2) for receiving the respective one of the first and second oscillation signals therefrom. The first inductor (TL4) has a first terminal that is used to receive a first supply voltage (V1), and a second terminal that is connected to the first terminal of the third transistor (M4). The fourth transistor (M5) has a first terminal, a second terminal that is connected to the reference node, and a control terminal that is connected to the first terminal of the third transistor (M4). The second inductor (TL5) has a first terminal that is used to receive the first supply voltage (V1), and a second terminal that is connected to the first terminal of the fourth transistor (M5). The first capacitor (Co2) has a first terminal that is connected to the first terminal of the fourth transistor (M5), and a second terminal that provides the respective one of the first and second output signals (Von1, Von2). The third transistor (M4) and the first inductor (TL4) cooperatively form a first buffering stage. The fourth transistor (M5), the second inductor (TL5) and the first capacitor (Co2) cooperatively form a second buffering stage. The first capacitor (Co2) is used for alternating current (AC) coupling and direct current (DC) blocking.

The push-push module 1 is used to receive a second supply voltage (V2), and is connected to the center terminal of the first center-tapped inductor (L1) for providing the second supply voltage (V2) thereto. The push-push module 1 attenuates the third oscillation signal provided at the center terminal of the first center-tapped inductor (L1) in frequencies that are outside a frequency band containing a second oscillation frequency which is twice the first oscillation frequency (i.e., the second oscillation frequency equals 2×f0). In this embodiment, the push-push module 1 includes a third inductor (TL) and a second capacitor (C2). The third inductor (TL) has a first terminal that receives the second supply voltage (V2), and a second terminal that is connected to the center terminal of the first center-tapped inductor (L1). The second capacitor (C2) is connected between the first terminal of the third inductor (TL) and the reference node. The third inductor (TL) is used for providing the second supply voltage (V2) to the center terminal of the first center-tapped inductor (L1), and for attenuating the third oscillation signal. The second capacitor (C2) is used for stabilizing the second supply voltage (V2). In this embodiment, the third inductor (TL) is a transmission line inductor having a length that substantially equals a quarter of a wavelength which corresponds to the second oscillation frequency of 2×f0 (i.e., $[(3\times10^8)/(2\times f0)]\times(1/4)$ meter).

Under a circumstance where the push-push module 1 is omitted, the third oscillation signal has frequencies of f0, 2×f0, 3×f0, 4×f0, etc. In this embodiment, by virtue of the push-push module 1, the third oscillation signal only has the second oscillation frequency of 2×f0.

The amplifying module 21 is connected to the center terminal of the first center-tapped inductor (L1) for receiving the third oscillation signal therefrom, and amplifies the third oscillation signal to generate an amplified oscillation signal with the second oscillation frequency of 2×f0. In this embodiment, the amplifying module 21 includes a fourth inductor (TL3), a third capacitor (C1), a fifth inductor (TL2), a fifth transistor (M3) and a sixth inductor (TL1). The fourth inductor (TL3) has a first terminal that is connected to the center terminal of the first center-tapped inductor (L1) for receiving the third oscillation signal therefrom, and a second terminal. The third capacitor (C1) is connected to the fourth inductor (TL3) in parallel. The fifth inductor (TL2) has a first terminal that is connected to the second terminal of the fourth inductor (TL3), and a second terminal. The fifth transistor (M3) has a first terminal that is connected to the second terminal of the fourth inductor (TL3) and that provides the amplified oscillation signal, a second terminal that is connected to the reference node, and a control terminal that is connected to the second terminal of the fifth inductor (TL2). The sixth inductor (TL1) has a first terminal that is used to receive the first supply voltage (V1), and a second terminal that is connected to the second terminal of the fourth inductor (TL3).

The single-ended to differential converting module 22 is connected to the amplifying module 21 for receiving the amplified oscillation signal therefrom, and converts the amplified oscillation signal into a second differential output signal pair that includes a third output signal (Vop1) and a fourth output signal (Vop2) and that has the second oscillation frequency of 2×f0. In this embodiment, the single-ended to differential converting module 22 includes a balun (B) and two fourth capacitors (Co1). The balun (B) has an input terminal that is connected to the second terminal of the fourth inductor (TL3) for receiving the amplified oscillation signal therefrom, a first output terminal and a second output terminal. Each fourth capacitor (Co1) has a first terminal that is connected to a respective one of the first and second output terminals of the balun (B), and a second terminal that provides a respective one of the third and fourth output signals (Vop1, Vop2). Each fourth capacitor (Co1) is used for AC coupling and DC blocking.

Figure 3:
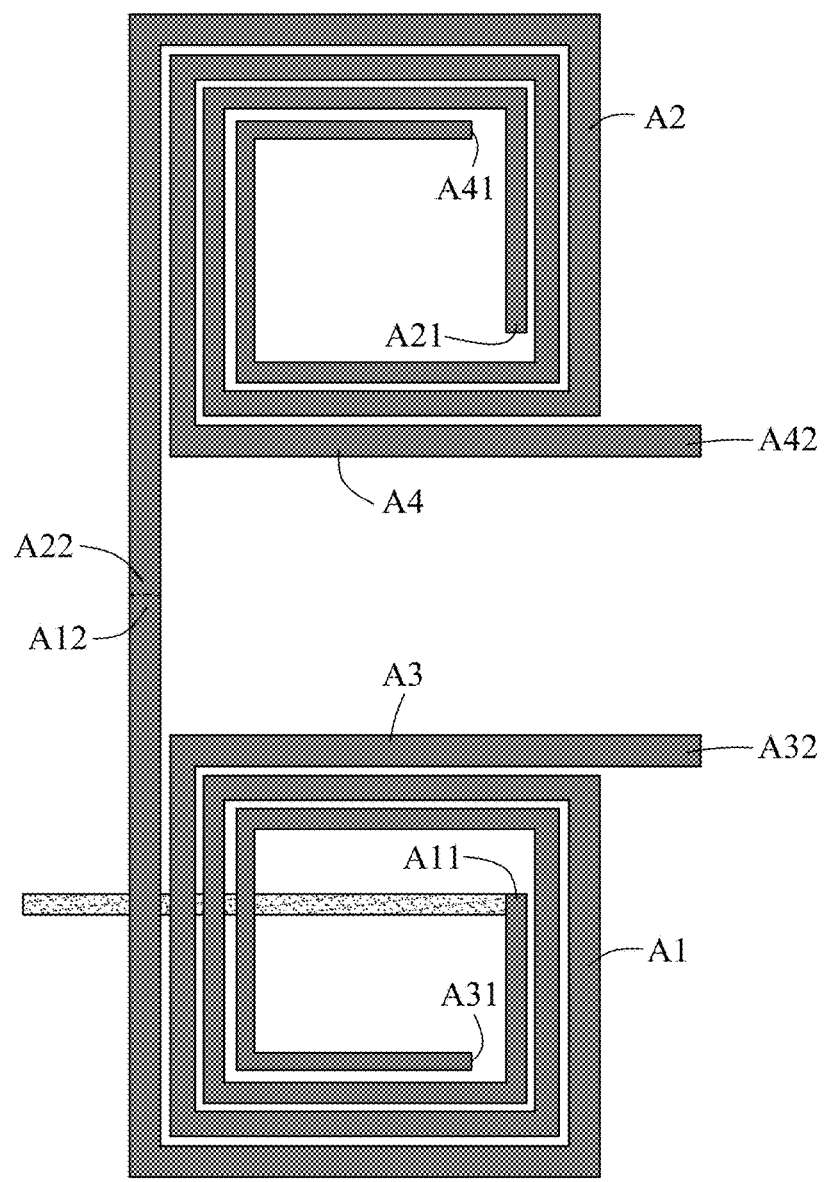
FIG. 3 is a layout diagram illustrating a first implementation of a balun of the first embodiment.
Figure 4:
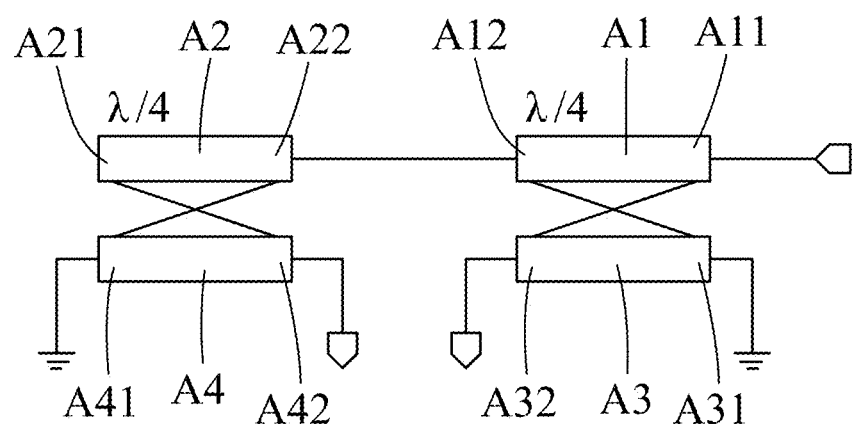
FIG. 4 is a circuit diagram illustrating the first implementation of the balun of the first embodiment.

Referring to FIGS. 3 and 4, a first implementation of the balun (B) includes a first transmission line (A1), a second transmission line (A2), a third transmission line (A3) and a fourth transmission line (A4). The first and third transmission lines (A1, A3) are configured as interwound spirals so as to be mutual-inductively coupled to each other. The second and fourth transmission lines (A2, A4) are configured as interwound spirals so as to be mutual-inductively coupled to each other. The first transmission line (A1) has an inner terminal (A11) that serves as the input terminal of the balun (B), and an outer terminal (A12). The second transmission line (A2) has an inner terminal (A21), and an outer terminal (A22) that is connected to the outer terminal (A12) of the first transmission line (A1). The third transmission line (A3) has an inner terminal (A31) that is connected to the reference node, and an outer terminal (A32) that serves as the first output terminal of the balun (B). The fourth transmission line (A4) has an inner terminal (A41) that is connected to the reference node, and an outer terminal (A42) that serves as the second output terminal of the balun (B). Each of the first to fourth transmission lines (A1-A4) has a length that substantially equals a quarter of the wavelength ($\lambda$) which corresponds to the second oscillation frequency of 2×f0 (i.e., $\lambda/4=[(3\times10^8)/(2\times f0)]\times(1/4)$ meter). Each of the first to fourth transmission lines (A1-A4) has a width that increases from the inner terminal thereof (A11-A41) to the outer terminal thereof (A12-A42).

Figure 5:
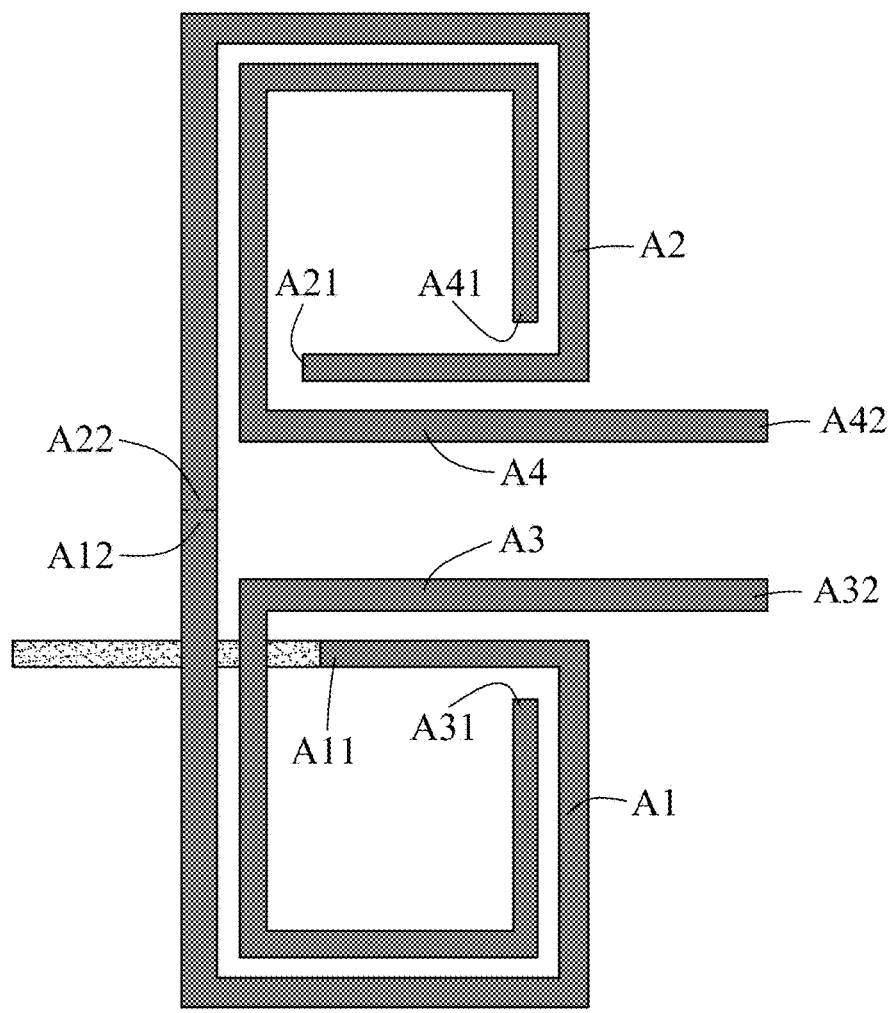
FIG. 5 is a layout diagram illustrating a second implementation of the balun of the first embodiment.
Figure 6:
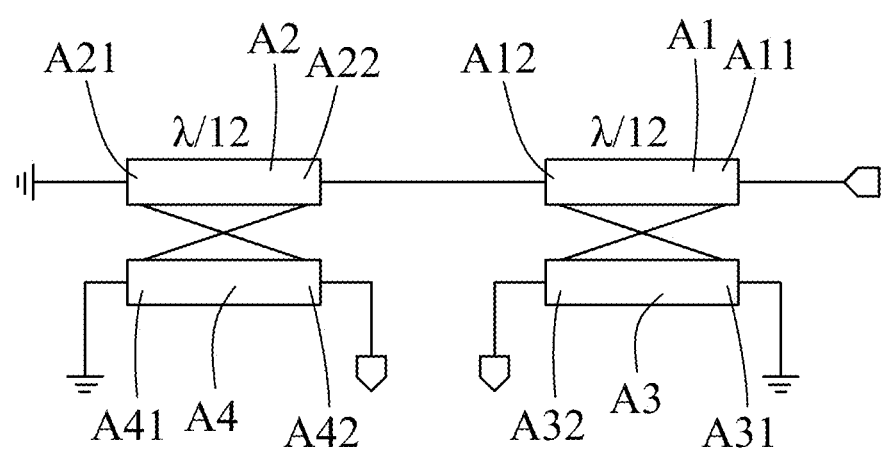
FIG. 6 is a circuit diagram illustrating the second implementation of the balun of the first embodiment.

Referring to FIGS. 5 and 6, a second implementation of the balun (B) is similar to the first implementation, and differs from the first implementation in that: (a) the inner terminal (A21) of the second transmission line (A2) is connected to the reference node; and (b) the length of each of the first to fourth transmission lines (A1-A4) substantially equals one-twelfth of the wavelength ($\lambda$) which corresponds to the second oscillation frequency of 2×f0 (i.e., $\lambda/12=[(3\times10^8)/(2\times f0)]\times(1/12)$ meter). Since the length of each of the first to fourth transmission lines (A1-A4) is shorter in the second implementation than in the first implementation, the balun (B) may occupy a smaller area in the second implementation than in the first implementation, which is beneficial to reduce the occupied area and the costs of the VCO of this embodiment.

Referring to FIG. 2, in this embodiment, each of the first to fifth transistors (M1-M5) is an N-type metal oxide semiconductor field effect transistor having a drain terminal, a source terminal and a gate terminal that respectively serve as the first, second and control terminals of the transistor (M1-M5). Moreover, each of the first, second and fourth to sixth inductors (TL1-TL5) may be an inductor that is modeled by a semiconductor foundry and that occupies a relatively large area due to inclusion of an electrostatic protection ring, or may be a transmission line inductor that is specifically designed so as to occupy a relatively small area. It should be noted that each transmission line inductor may be implemented using a microstrip.

Figure 7:
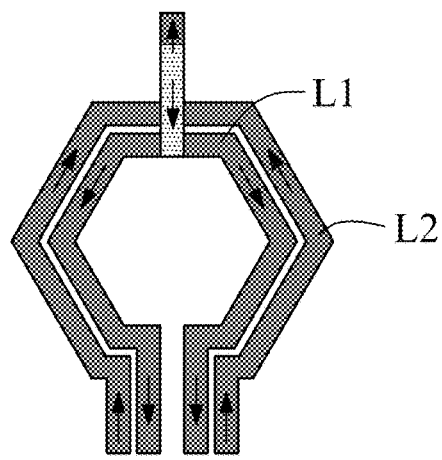
FIG. 7 is a layout diagram illustrating a first center-tapped inductor and a second center-tapped inductor of the first embodiment.

In this embodiment, since the first and second center-tapped inductors (L1, L2) are mutual-inductively coupled to each other, each of the first and second center-tapped inductors (L1, L2) has a relatively large inductance per unit length. Therefore, the first and second center-tapped inductors (L1, L2) may occupy a relatively small area, which is beneficial to reduce the occupied area and the costs of the VCO. FIG. 7 illustrates an exemplary implementation of the first and second center-tapped inductors (L1, L2). In the exemplary implementation, the first and second center-tapped inductors (L1, L2) are wound around the same center point, such that they are mutual-inductively coupled to each other, and such that the area thereof is relatively small. Moreover, the voltage polarities of the first and second center-tapped inductors (L1, L2) make a current flowing in the first center-tapped inductor (L1) opposite in direction to a current flowing in the second center-tapped inductor (L2).

Figure 8:
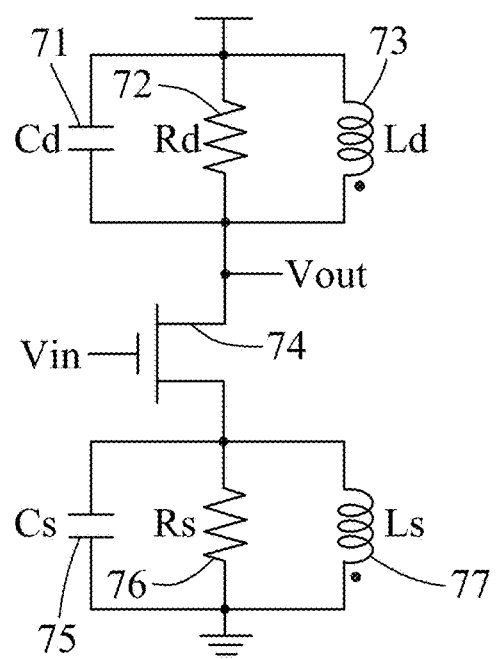
FIG. 8 is a circuit diagram illustrating an equivalent half circuit of a combination of a first LC tank, a second LC tank and a cross-connected pair of the first embodiment.

An equivalent half circuit of a combination of the first and second LC tanks 4, 5 and the cross-connected pair 6 is shown in FIG. 8. The equivalent half circuit includes a capacitor 71 with a capacitance of Cd, a resistor 72 with a resistance of Rd, an inductor 73 with an inductance of Ld, a transistor 74 with a transconductance of gm, a capacitor 75 with a capacitance of Cs, a resistor 76 with a resistance of Rs, and an inductor 77 with an inductance of Ls. The capacitor 71, the resistor 72 and the inductor 73 correspond to the first LC tank 4. The capacitor 75, the resistor 76 and the inductor 77 correspond to the second LC tank 5. The transistor 74 corresponds to the cross-connected pair 6. The equivalent half circuit receives an input signal (Vin) and provides an output signal (Vout), and has a gain (Vout/Vin) that can be expressed by the following equation:

$$\frac{Vout}{Vin} = \qquad\qquad\qquad\qquad\text{Equation 1}$$

-continued $$\frac{s \cdot gm \cdot (Ld + Ls - 2 \cdot \sqrt{Ld \cdot Ls})}{s \cdot \left(\sqrt{\frac{Ls}{Ld}} - 1\right) \cdot \left(\frac{1 + s \cdot Rs \cdot Cs}{Rs} \cdot Ls + \frac{1 + s \cdot Rd \cdot Cd}{Rd} \cdot Ld\right) +}$$
$$s \cdot gm \cdot Ls \cdot \left(\sqrt{\frac{Ld}{Ls}} + \sqrt{\frac{Ls}{Ld}} - 2\right) + \sqrt{\frac{Ls}{Ld}} - 1$$

Equation 1 can be rearranged as the following equation:

$$\frac{Vout}{Vin} = \frac{s \cdot gm \cdot Ld \cdot \frac{KL + 1 - 2 \cdot \sqrt{KL}}{\sqrt{KL} \cdot (1 - \sqrt{KL})}}{s^2 \cdot Ld \cdot Cd \cdot \left(1 + \frac{1}{KL \cdot KC}\right) + s \cdot \left(gm \cdot Ld \cdot \frac{KL + 1 - 2 \cdot \sqrt{KL}}{KL \cdot (1 - \sqrt{KL})} + \frac{1}{\omega} \cdot \frac{Qd + Qs}{Qd \cdot Qs}\right) + 1},$$

Equation 2 where KL=Ld/Ls, KC=Cd/Cs, Qd=Rd/(ω·Ld), Qs=Rs/(ω·Ls), Qd is a quality factor of a combination of the capacitor 71, the resistor 72 and the inductor 73, Qs is a quality factor of a combination of the capacitor 75, the resistor 76 and the inductor 77, and ω is an angular frequency.

The combination of the first and second LC tanks 4, 5 and the cross-connected pair 6 has a closed-loop gain that equals the square of the gain of the equivalent half circuit. According to Barkhausen's criterion, the closed-loop gain of the combination of the first and second LC tanks 4, 5 and the cross-connected pair 6 must be infinite. In other words, a denominator of the closed-loop gain of the combination of the first and second LC tanks 4, 5 and the cross-connected pair 6 must be zero. Therefore, a denominator of the gain of the equivalent half circuit must be zero. That is to say, the denominator of the gain of the equivalent half circuit must have a zero real part, and a zero imaginary part which can be expressed by the following equation:

$$s^2 \cdot Ld \cdot Cd \cdot \left(1 + \frac{1}{KL \cdot KC}\right) + 1 = 0.$$

Equation 3

From Equation 3, since 1/(KL·KC) is generally far less than one, an angular frequency (ω0) that corresponds to the first oscillation frequency of f0 can be expressed by the following equation:

$$\omega 0 = 2\pi \cdot f0 = \sqrt{\frac{1}{Ld \cdot Cd} \cdot \frac{1}{1 + \frac{1}{KL \cdot KC}}} \approx \frac{1}{\sqrt{Ld \cdot Cd}}.$$

Equation 4

A quality factor (Qc) of the combination of the first and second LC tanks 4, 5 and the cross-connected pair 6 can be expressed by the following equation:

$$Qc = \left[\frac{1}{Qd} \cdot \left(1 - gm \cdot Rd \cdot \frac{1 + KL - 2 \cdot \sqrt{KL}}{KL \cdot (1 - \sqrt{KL})}\right) + \frac{1}{Qs}\right]^{-1}.$$

Equation 5

When Qd is far greater than Qs, Equation 5 can be approximated as the following equation:

$$Qc = Qd \cdot \frac{A}{A - gm \cdot Rd},$$

Equation 6 where A=⌊KL·(1−√KL)⌋/(1+KL−2·√KL). It is known from Equation 6 that the quality factor (Qc) can be enhanced.

Figure 9:
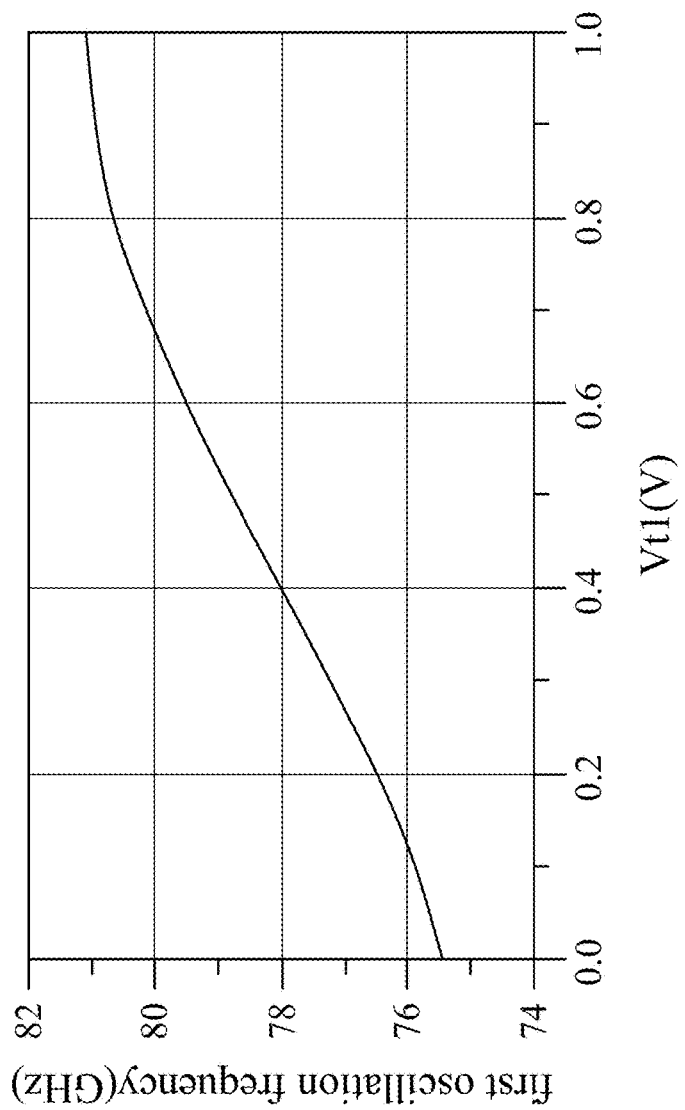
FIG. 9 is a plot illustrating a simulated first oscillation frequency versus a first control voltage of the first embodiment.

FIG. 9 illustrates the relationship between the first oscillation frequency and the first control voltage (Vt1) when the second control voltage (Vt2) is 0V. It is known from FIG. 9 that the first oscillation frequency is within 75.44 GHz to 81.13 GHz when the first control voltage (Vt1) is adjusted to be within 0V to 1V. Therefore, the VCO of this embodiment can operate in the W band.

Figure 10:
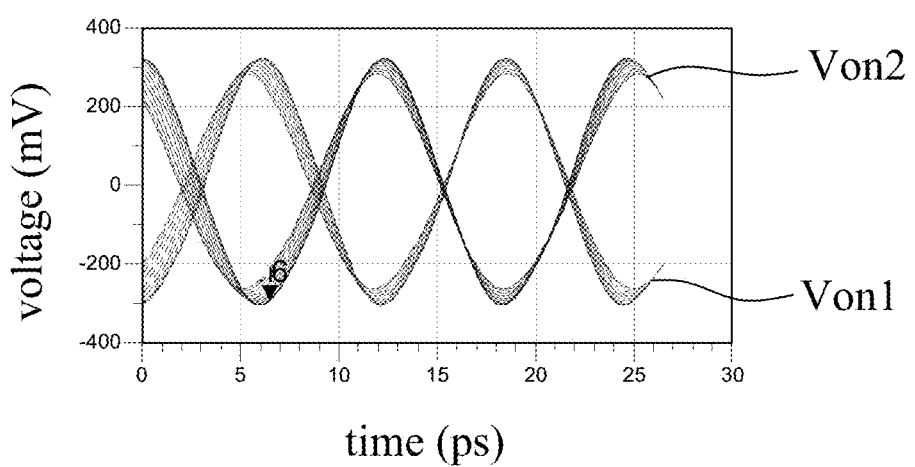
FIG. 10 is a timing diagram illustrating simulated waveforms of a first output signal and a second output signal of the first embodiment.

FIG. 10 illustrates waveforms of the first and second output signals (Von1, Von2). It is known from FIG. 10 that the first and second output signals (Von1, Von2) have the same voltage amplitude. Therefore, the VCO of this embodiment has little influence on performances of a circuit (e.g., isolation and a conversion gain of a mixer) that operates based on the first and second output signals (Von1, Von2).

Figure 11:
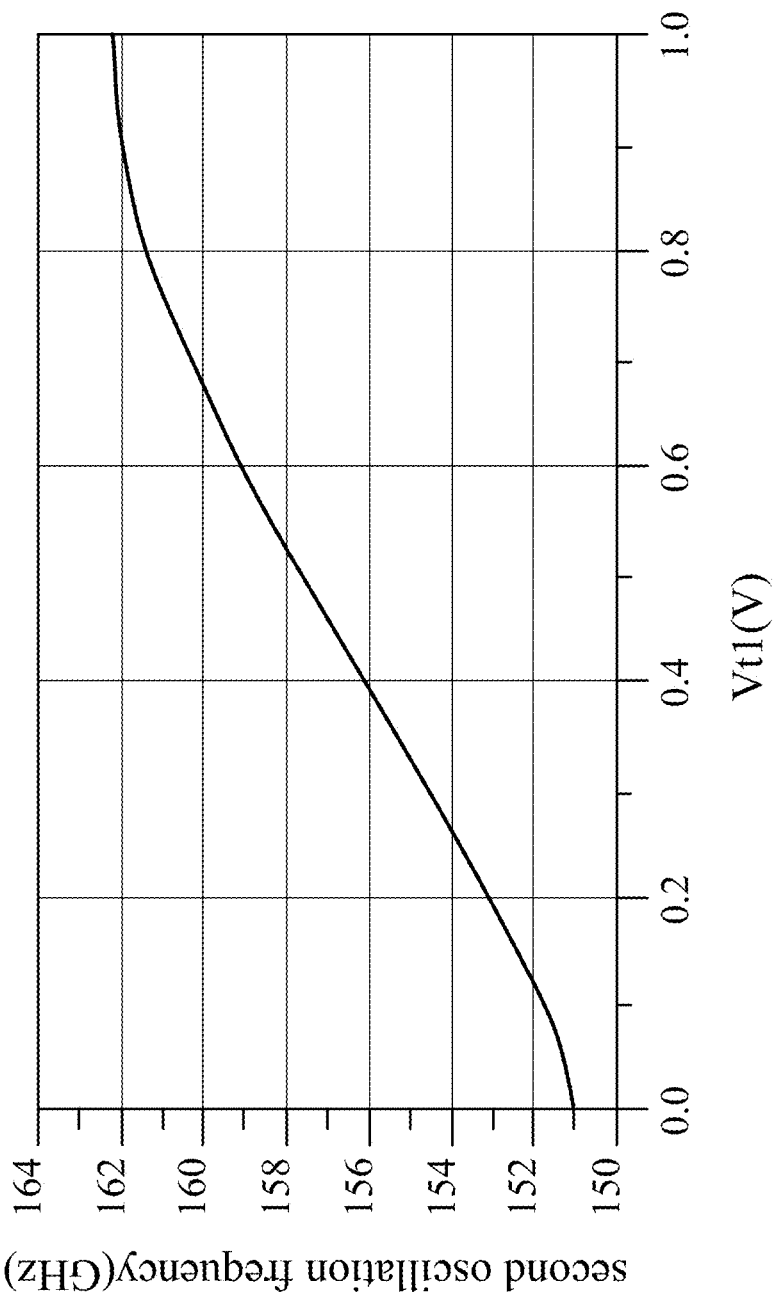
FIG. 11 is a plot illustrating a simulated second oscillation frequency versus the first control voltage of the first embodiment.

FIG. 11 illustrates the relationship between the second oscillation frequency and the first control voltage (Vt1) when the second control voltage (Vt2) is 0V. It is known from FIG. 11 that the second oscillation frequency is within 150.9 GHz to 162.3 GHz when the first control voltage (Vt1) is adjusted to be within 0V to 1V. Therefore, the VCO of this embodiment also can operate in the G band.

Figure 12:
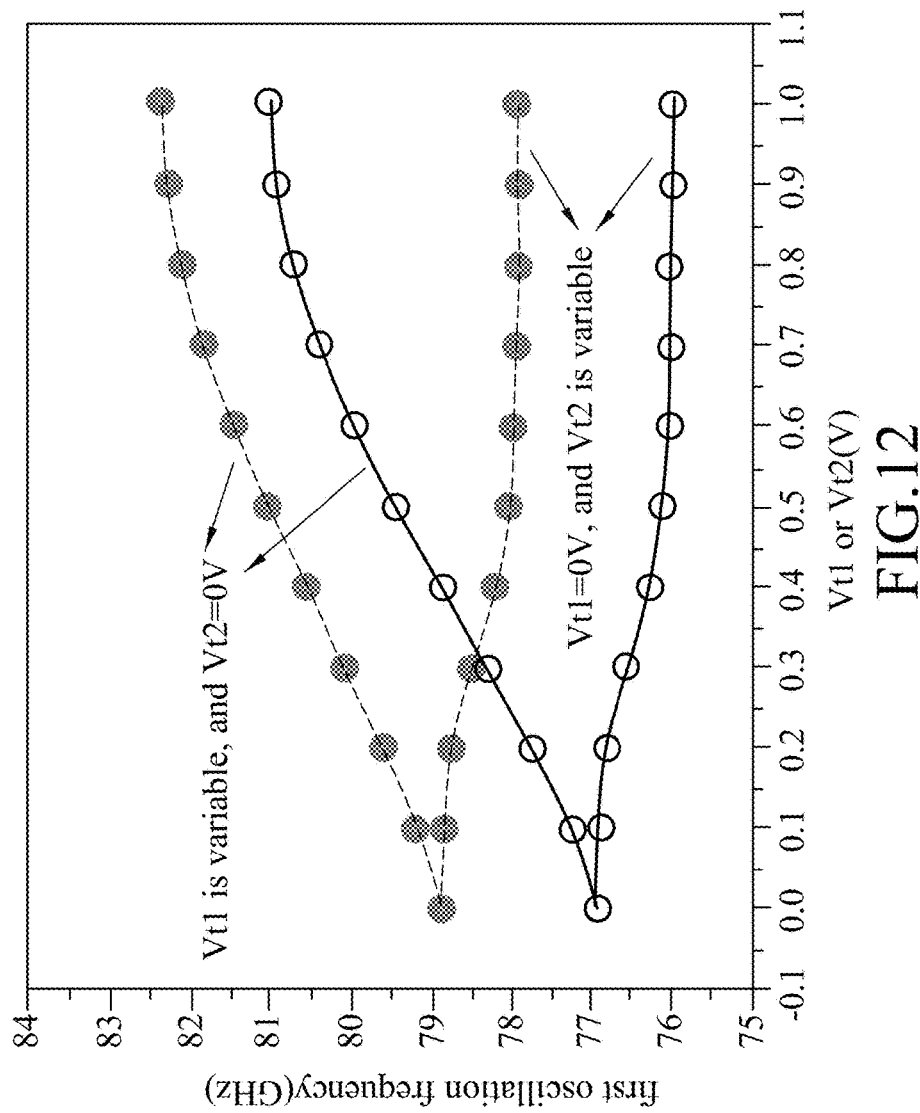
FIG. 12 is a plot illustrating the simulated first oscillation frequency versus the first or second control voltage in various conditions.

FIG. 12 illustrates the relationship between the first oscillation frequency and the first or second control voltage (Vt1, Vt2) under various settings of the inductances of the first and second center-tapped inductors (L1, L2) (see FIG. 2). It is known from FIG. 12 that: (a) under a first setting of the inductances of the first and second center-tapped inductors (L1, L2), where the relationship between the first oscillation frequency and the first or second control voltage (Vt1, Vt2) is depicted by dashed lines, the first oscillation frequency has a relatively high adjustable range with a width of 4.45 GHz; and (b) under a second setting of the inductances of the first and second center-tapped inductors (L1, L2), where the relationship between the first oscillation frequency and the first or second control voltage (Vt1, Vt2) is depicted by solid lines, the adjustable range of the first oscillation frequency is relatively low, and the width thereof is 5.02 GHz. Therefore, when designing the VCO of this embodiment, one can adjust the inductances of the first and second center-tapped inductors (L1, L2) to shift the adjustable range of the first oscillation frequency and to change the width of the same.

Figure 13:
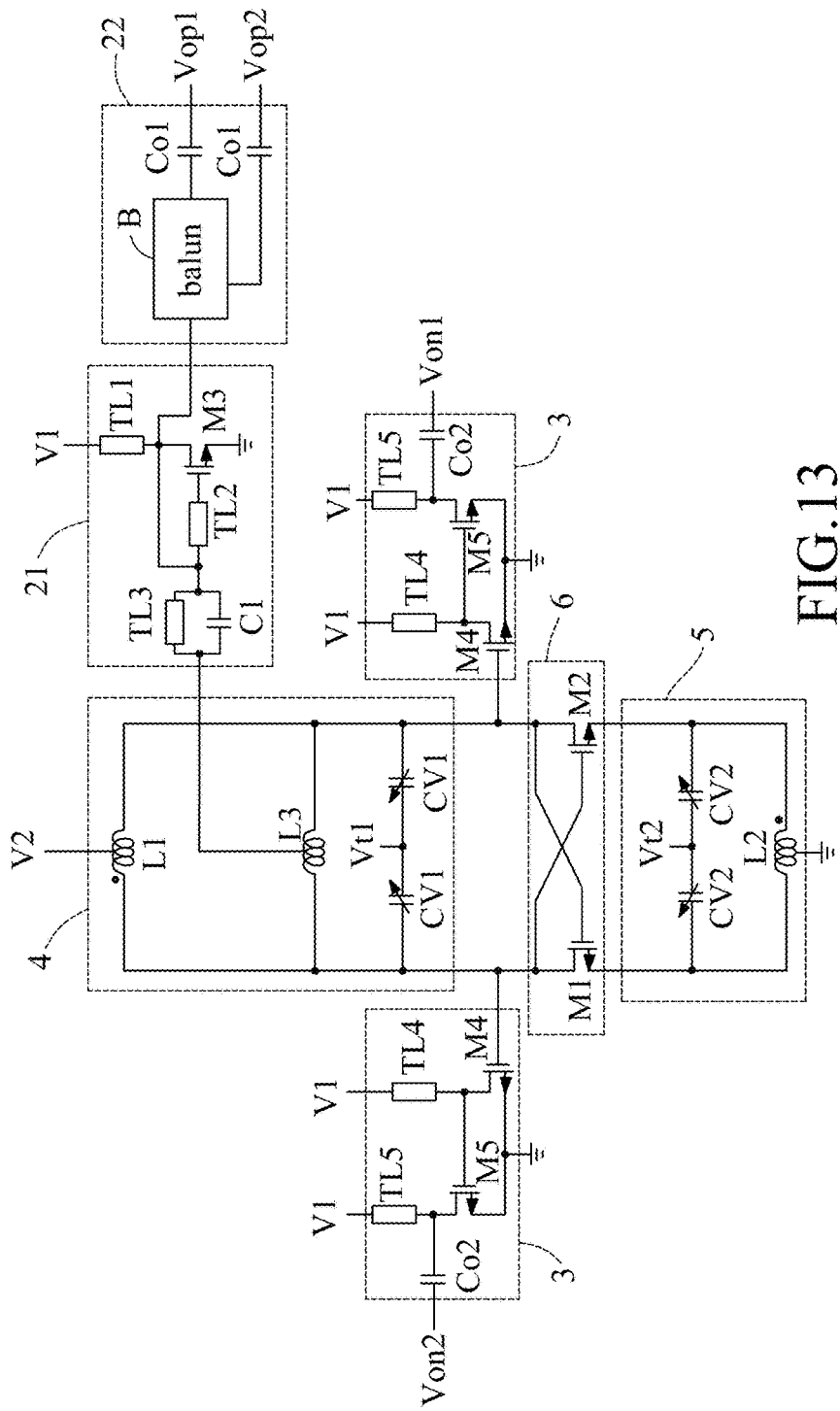
FIG. 13 is a circuit block diagram illustrating a second embodiment of the VCO according to the disclosure.

Referring to FIG. 13, a second embodiment of the VCO according to the disclosure is a modification of the first embodiment, and differs from the first embodiment in that the push-push module 1 (see FIG. 2) is omitted and that a third center-tapped inductor (L3) is included. In the second embodiment, the center terminal of the first center-tapped inductor (L1) is used to receive the second supply voltage (V2); and the third center-tapped inductor (L3) is connected between the first terminals of the first and second transistors (M1, M2), and has a center terminal that is connected to the first terminal of the fourth inductor (TL3) for providing thereto the third oscillation signal with the second oscillation frequency of 2×f0.

Figure 14:
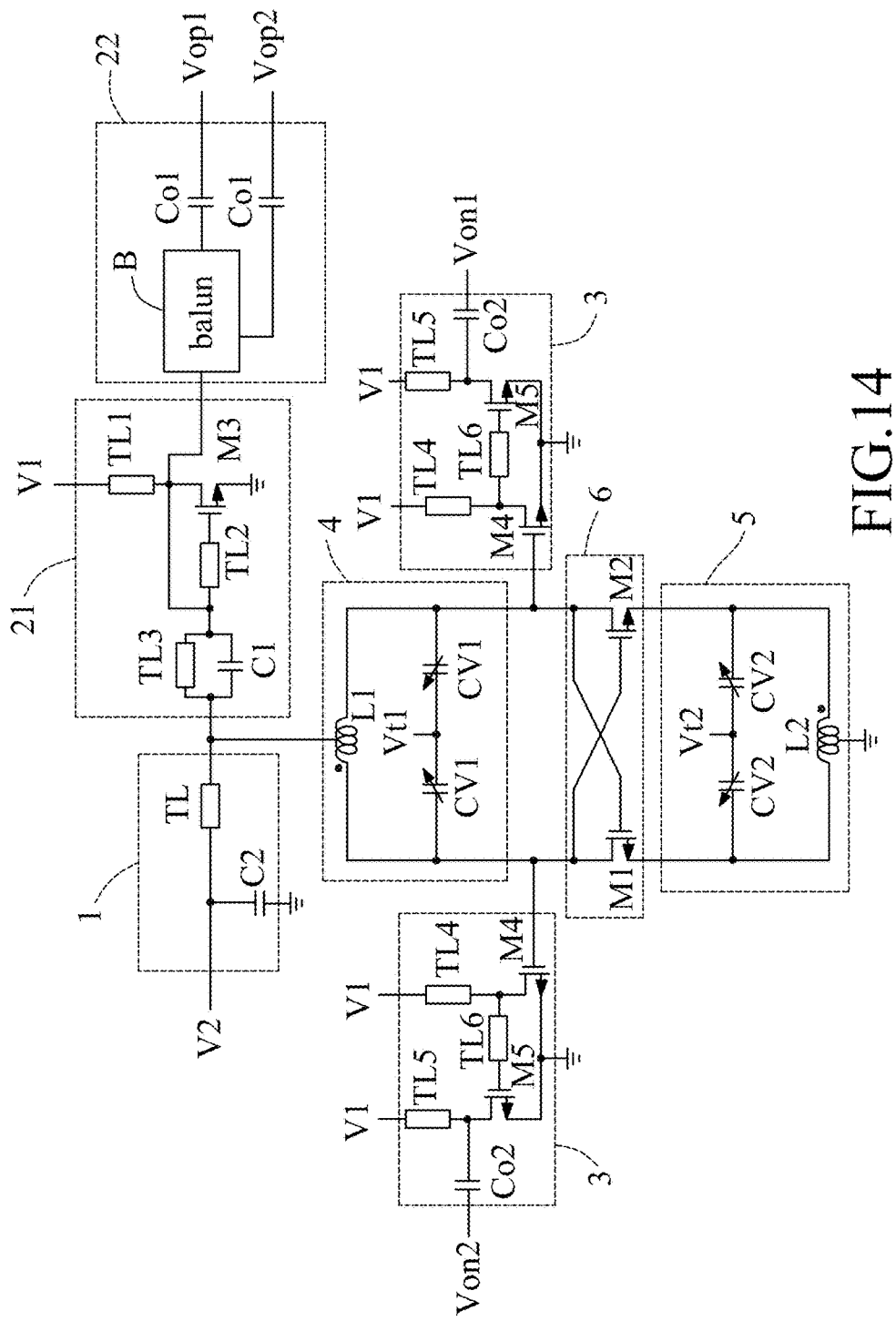
FIG. 14 is a circuit block diagram illustrating a third embodiment of the VCO according to the disclosure.

Referring to FIG. 14, a third embodiment of the VCO according to the disclosure is a modification of the first embodiment, and differs from the first embodiment in that each buffering module 3 further includes a seventh inductor (TL6), e.g., a transmission line inductor, which is connected between the first terminal of the third transistor (M4) and the control terminal of the fourth transistor (M5). In the third embodiment, for each buffering module 3, the seventh inductor (TL6) cooperates with the fourth transistor (M5), the second inductor (TL5) and the first capacitor (Co2) to form the second buffering stage of the buffering module 3.

Figure 15:
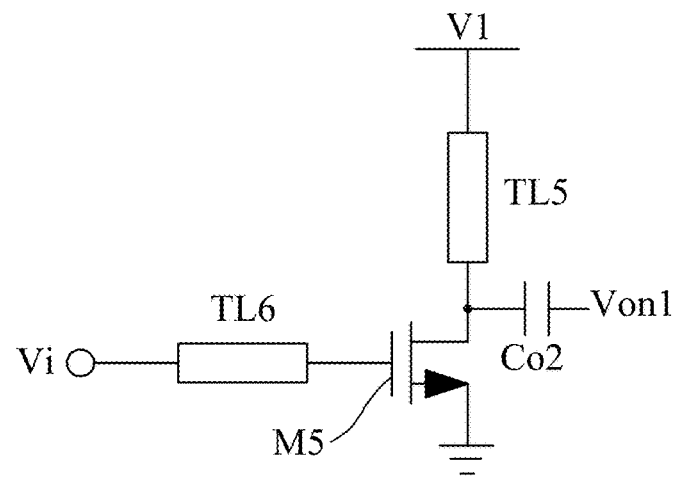
FIG. 15 is a circuit diagram illustrating a second buffering stage of a buffering module of the third embodiment.
Figure 16:
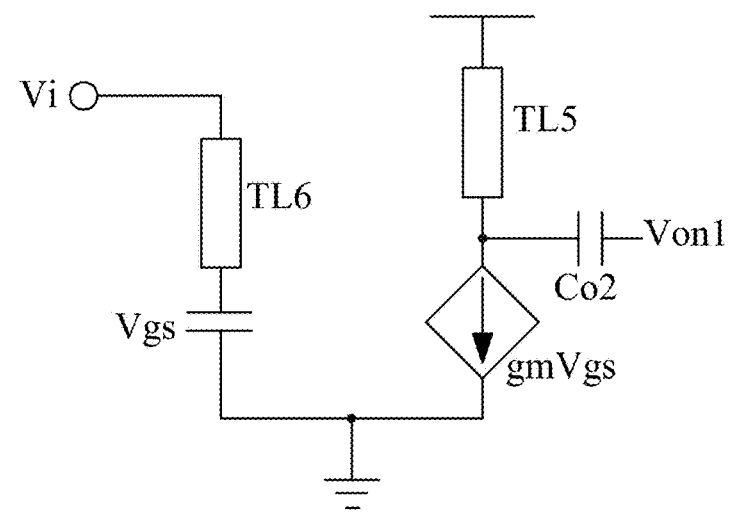
FIG. 16 is a circuit diagram illustrating a small signal equivalent circuit of the second buffering stage of the buffering module of the third embodiment.

Referring to FIGS. 14, 15 and 16, in order to facilitate description of this embodiment, the second buffering stage of the buffering module 3 that generates the first output signal (Von1) is depicted in FIG. 15, and a small signal equivalent circuit thereof is depicted in FIG. 16. The second buffering stage shown in FIG. 16 has a gain (Von1/Vi) that can be expressed by the following equation:

$$\frac{Von1}{Vi} = \frac{Von1}{Vgs} \cdot \frac{Vgs}{Vi} = (-gm \cdot s \cdot L5) \cdot \left( \frac{\frac{1}{s \cdot Cgs}}{\frac{1}{s \cdot Cgs} + s \cdot L6} \right) =$$

$$(-gm \cdot s \cdot L5) \cdot \left( \frac{1}{1 - \omega^2 \cdot L6 \cdot Cgs} \right),$$

Equation 7 where Vi denotes a voltage provided at the first terminal of the seventh inductor (TL6), Vgs denotes a voltage provided between the control and second terminals of the fourth transistor (M5), Cgs denotes a parasitic capacitance provided between the control and second terminals of the fourth transistor (M5), gm denotes a transconductance of the fourth transistor (M5), L5 denotes an inductance of the second inductor (TL5), L6 denotes an inductance of the seventh inductor (TL6), and ω denotes the angular frequency. It is known from Equation 7 that the seventh inductor (TL6) can boost the gain of the second buffering stage of the corresponding buffering module 3 (as well as a gain of the corresponding buffering module 3) without influencing the first and second oscillation frequencies, and that greater inductance of the seventh inductor (TL6) leads to a higher gain of the second buffering stage of the corresponding buffering module 3. As a result, output power of the VCO of this embodiment is increased as well.

Figure 17:
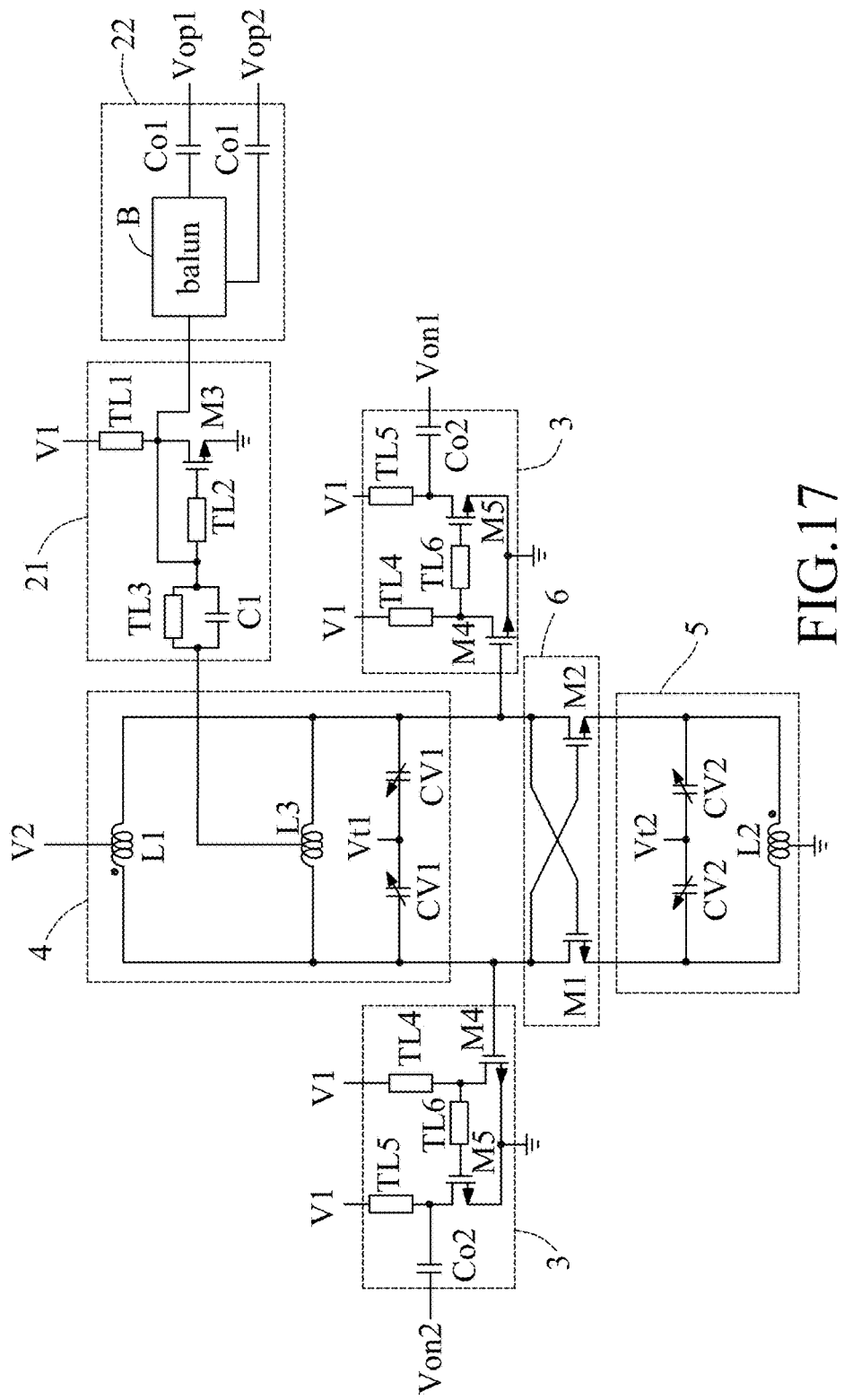
FIG. 17 is a circuit block diagram illustrating a fourth embodiment of the VCO according to the disclosure.

Referring to FIG. 17, a fourth embodiment of the VCO according to the disclosure is a modification of the second embodiment, and differs from the second embodiment in that each buffering module 3 further includes a seventh inductor (TL6), e.g., a transmission line inductor, which is connected between the first terminal of the third transistor (M4) and the control terminal of the fourth transistor (M5). In the fourth embodiment, for each buffering module 3, the seventh inductor (TL6) cooperates with the fourth transistor (M5), the second inductor (TL5) and the first capacitor (Co2) to form the second buffering stage of the buffering module 3, where the inclusion of the seventh inductor (TL6) can boost the gain of the second buffering stage of the buffering module 3 (as well as the gain of the buffering module 3) without influencing the first and second oscillation frequencies.

In view of the above, the VCO of each of the first to fourth embodiments has the following advantages:

1. Since the mutual-inductive coupling between the first and second center-tapped inductors (L1, L2) can increase the inductance per unit length of each of the first and second center-tapped inductors (L1, L2), the area of the first and second center-tapped inductors (L1, L2) may be relatively small, which is beneficial to reduce the occupied area and the costs of the VCO.

2. Since not only the capacitances of the first varactors (CV1) but also the capacitances of the second varactors (CV2) are variable, the adjustable range of each of the first and second oscillation frequencies is relatively wide.

3. Since the first differential output signal pair with the first oscillation frequency of f0 and the second differential output signal pair with the second oscillation frequency of 2×f0 are provided, the VCO is suitable for a system that operates based on two differential output signal pairs with different frequencies.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment (s), it is understood that the disclosure is not limited to the disclosed embodiment(s) but is intended to cover various arrangements included within the spirit and scope of the broadest interpretation so as to encompass all such modifications and equivalent arrangements.

What is claimed is:

1. A voltage-controlled oscillator (VCO) comprising:
   a first transistor having a first terminal, a second terminal and a control terminal;
   a second transistor having a first terminal that is connected to said control terminal of said first transistor, a second terminal, and a control terminal that is connected to said first terminal of said first transistor;
   a first center-tapped inductor having a first end terminal that is connected to said first terminal of said first transistor, a second end terminal that is connected to said first terminal of said second transistor, and a center terminal;
   two first varactors, each having a first terminal that is used to receive a first control voltage, a second terminal that is connected to said first terminal of a respective one of said first and second transistors, and a capacitance that is variable according to the first control voltage;
   a second center-tapped inductor mutual-inductively coupled to said first center-tapped inductor, and having a first end terminal that is connected to said second terminal of said first transistor, a second end terminal that is connected to said second terminal of said second transistor, and a center terminal that is connected to a reference node; and
   two second varactors, each having a first terminal that is used to receive a second control voltage, a second terminal that is connected to said second terminal of a respective one of said first and second transistors, and a capacitance that is variable according to the second control voltage;

wherein a first oscillation signal with a first oscillation frequency is provided at said first terminal of said first transistor, and a second oscillation signal with the first oscillation frequency is provided at said first terminal of said second transistor;

said VCO further comprising:

a push-push module used to receive a first supply voltage, and connected to said center terminal of said first center-tapped inductor for providing the first supply voltage thereto, said push-push module attenuating a third oscillation signal provided at said center terminal of said first center-tapped inductor in frequencies that are outside a frequency band containing a second oscillation frequency which is twice the first oscillation frequency; and an amplifying module connected to said center terminal of said first center-tapped inductor for receiving the third oscillation signal therefrom, and amplifying the third oscillation signal to generate an amplified oscillation signal.

2. The VCO of claim 1, wherein said first end terminal of said first center-tapped inductor and said second end terminal of said second center-tapped inductor have the same voltage polarity.

3. The VCO of claim 1, wherein said push-push module includes:

a transmission line inductor having a first terminal that is used to receive the first supply voltage, a second terminal that is connected to said center terminal of said first center-tapped inductor, and a length that substantially equals a quarter of a wavelength which corresponds to the second oscillation frequency.

4. The VCO of claim 1, wherein said amplifying module includes:

a first inductor having a first terminal that is connected to said center terminal of said first center-tapped inductor for receiving the third oscillation signal therefrom, and a second terminal;

a capacitor connected to said first inductor in parallel;

a second inductor having a first terminal that is connected to said second terminal of said first inductor, and a second terminal;

a third transistor having a first terminal that is connected to said second terminal of said first inductor and that provides the amplified oscillation signal, a second terminal that is connected to the reference node, and a control terminal that is connected to said second terminal of said second inductor; and a third inductor having a first terminal that is used to receive a second supply voltage, and a second terminal that is connected to said second terminal of said first inductor.

5. The VCO of claim 1, further comprising:

a single-ended to differential converting module connected to said amplifying module for receiving the amplified oscillation signal therefrom, and converting the amplified oscillation signal into a differential output signal pair.

6. The VCO of claim 5, wherein the differential output signal pair includes a first output signal and a second output signal, and said single-ended to differential converting module includes:

a balun having an input terminal that is connected to said amplifying module for receiving the amplified oscillation signal therefrom, a first output terminal and a second output terminal; and two capacitors, each having a first terminal that is connected to a respective one of said first and second output terminals of said balun, and a second terminal that provides a respective one of the first and second output signals.

7. The VCO of claim 6, wherein said balun includes a first transmission line, a second transmission line, a third transmission line and a fourth transmission line;

said first and third transmission lines being configured as interwound spirals;

said second and fourth transmission lines being configured as interwound spirals;

said first transmission line having an inner terminal that serves as said input terminal of said balun, and an outer terminal;

said second transmission line having an outer terminal that is connected to said outer terminal of said first transmission line;

said third transmission line having an inner terminal that is connected to the reference node, and an outer terminal that serves as said first output terminal of said balun;

said fourth transmission line having an inner terminal that is connected to the reference node, and an outer terminal that serves as said second output terminal of said balun.

8. The VCO of claim 7, wherein each of said first to fourth transmission lines has a length that substantially equals a quarter of a wavelength which corresponds to the second oscillation frequency.

9. The VCO of claim 7, wherein each of said first to fourth transmission lines has a width that increases from said inner terminal thereof to said outer terminal thereof.

10. The VCO of claim 7, wherein said second transmission line further has an inner terminal that is connected to the reference node, and each of said first to fourth transmission lines has a length that substantially equals one-twelfth of a wavelength which corresponds to the second oscillation frequency.

11. The VCO of claim 1, further comprising:

two buffering modules, each connected to said first terminal of a respective one of said first and second transistors for receiving a respective one of the first and second oscillation signals therefrom, and buffering the respective one of the first and second oscillation signals to generate a respective one of a first output signal and a second output signal.

12. The VCO of claim 11, wherein each of said buffering modules includes:

a third transistor having a first terminal, a second terminal that is connected to the reference node, and a control terminal that is connected to said first terminal of said respective one of said first and second transistors for receiving the respective one of the first and second oscillation signals therefrom;

a first inductor having a first terminal that is used to receive a second supply voltage, and a second terminal that is connected to said first terminal of said third transistor;

a fourth transistor having a first terminal, a second terminal that is connected to the reference node, and a control terminal that is connected to said first terminal of said third transistor;

a second inductor having a first terminal that is used to receive the second supply voltage, and a second terminal that is connected to said first terminal of said fourth transistor; and a capacitor having a first terminal that is connected to said first terminal of said fourth transistor, and a second terminal that provides the respective one of the first and second output signals.

13. The VCO of claim 12, wherein each of said buffering modules further includes:
a third inductor connected between said first terminal of said third transistor and said control terminal of said fourth transistor.

14. A voltage-controlled oscillator (VCO) comprising:
a first transistor having a first terminal, a second terminal and a control terminal;
a second transistor having a first terminal that is connected to said control terminal of said first transistor, a second terminal, and a control terminal that is connected to said first terminal of said first transistor;
a first center-tapped inductor having a first end terminal that is connected to said first terminal of said first transistor, a second end terminal that is connected to said first terminal of said second transistor, and a center terminal;
two first varactors, each having a first terminal that is used to receive a first control voltage, a second terminal that is connected to said first terminal of a respective one of said first and second transistors, and a capacitance that is variable according to the first control voltage;
a second center-tapped inductor mutual-inductively coupled to said first center-tapped inductor, and having a first end terminal that is connected to said second terminal of said first transistor, a second end terminal that is connected to said second terminal of said second transistor, and a center terminal that is connected to a reference node;
two second varactors, each having a first terminal that is used to receive a second control voltage, a second terminal that is connected to said second terminal of a respective one of said first and second transistors, and a capacitance that is variable according to the second control voltage; and
a third center-tapped inductor connected between said first terminals of said first and second transistors, and having a center terminal;
wherein a first oscillation signal with a first oscillation frequency is provided at said first terminal of said first transistor, and a second oscillation signal with the first oscillation frequency is provided at said first terminal of said second transistor;
wherein said center terminal of said first center-tapped inductor is used to receive a first supply voltage, and a third oscillation signal with a second oscillation frequency that is twice the first oscillation frequency is provided at said center terminal of said third center-tapped inductor.

15. The VCO of claim 14, further comprising:
an amplifying module connected to said center terminal of said third center-tapped inductor for receiving the third oscillation signal therefrom, and amplifying the third oscillation signal to generate an amplified oscillation signal.

16. The VCO of claim 15, wherein said amplifying module includes:
a first inductor having a first terminal that is connected to said center terminal of said third center-tapped inductor for receiving the third oscillation signal therefrom, and a second terminal;
a capacitor connected to said first inductor in parallel;

a second inductor having a first terminal that is connected to said second terminal of said first inductor, and a second terminal;
a third transistor having a first terminal that is connected to said second terminal of said first inductor and that provides the amplified oscillation signal, a second terminal that is connected to the reference node, and a control terminal that is connected to said second terminal of said second inductor; and
a third inductor having a first terminal that is used to receive a second supply voltage, and a second terminal that is connected to said second terminal of said first inductor.

17. The VCO of claim 15, further comprising:
a single-ended to differential converting module connected to said amplifying module for receiving the amplified oscillation signal therefrom, and converting the amplified oscillation signal into a differential output signal pair.

18. The VCO of claim 17, wherein the differential output signal pair includes a first output signal and a second output signal, and said single-ended to differential converting module includes:
a balun having an input terminal that is connected to said amplifying module for receiving the amplified oscillation signal therefrom, a first output terminal and a second output terminal; and
two capacitors, each having a first terminal that is connected to a respective one of said first and second output terminals of said balun, and a second terminal that provides a respective one of the first and second output signals.

19. A voltage-controlled oscillator (VCO) comprising:
a first transistor having a first terminal, a second terminal and a control terminal;
a second transistor having a first terminal that is connected to said control terminal of said first transistor, a second terminal, and a control terminal that is connected to said first terminal of said first transistor;
a first center-tapped inductor having a first end terminal that is connected to said first terminal of said first transistor, a second end terminal that is connected to said first terminal of said second transistor, and a center terminal;
two first varactors, each having a first terminal that is used to receive a first control voltage, a second terminal that is connected to said first terminal of a respective one of said first and second transistors, and a capacitance that is variable according to the first control voltage;
a second center-tapped inductor mutual-inductively coupled to said first center-tapped inductor, and having a first end terminal that is connected to said second terminal of said first transistor, a second end terminal that is connected to said second terminal of said second transistor, and a center terminal that is connected to a reference node;
two second varactors, each having a first terminal that is used to receive a second control voltage, a second terminal that is connected to said second terminal of a respective one of said first and second transistors, and a capacitance that is variable according to the second control voltage; and
two buffering modules;
wherein a first oscillation signal with a first oscillation frequency is provided at said first terminal of said first transistor, and a second oscillation signal with the first oscillation frequency is provided at said first terminal of said second transistor;

wherein each of said buffering modules is connected to said first terminal of a respective one of said first and second transistors for receiving a respective one of the first and second oscillation signals therefrom, and buffers the respective one of the first and second oscillation signals to generate a respective one of a first output signal and a second output signal;

wherein each of said buffering modules includes a third transistor having a first terminal, a second terminal that is connected to the reference node, and a control terminal that is connected to said first terminal of said respective one of said first and second transistors for receiving the respective one of the first and second oscillation signals therefrom, a first inductor having a first terminal that is used to receive a supply voltage, and a second terminal that is connected to said first terminal of said third transistor, a fourth transistor having a first terminal, a second terminal that is connected to the reference node, and a control terminal, a second inductor having a first terminal that is used to receive the supply voltage, and a second terminal that is connected to said first terminal of said fourth transistor, a third inductor connected between said first terminal of said third transistor and said control terminal of said fourth transistor, and a capacitor having a first terminal that is connected to said first terminal of said fourth transistor, and a second terminal that provides the respective one of the first and second output signals.

* * * * *